United States Patent
Zhu et al.

(10) Patent No.: US 8,829,576 B2
(45) Date of Patent: Sep. 9, 2014

(54) SEMICONDUCTOR STRUCTURE AND METHOD OF MANUFACTURING THE SAME

(71) Applicant: Institute of Microelectronics, Chinese Academy of Sciences, Beijing (CN)

(72) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/001,216

(22) PCT Filed: Nov. 27, 2012

(86) PCT No.: PCT/CN2012/085343
§ 371 (c)(1),
(2), (4) Date: Aug. 23, 2013

(87) PCT Pub. No.: WO2014/056277
PCT Pub. Date: Apr. 17, 2014

(65) Prior Publication Data
US 2014/0217421 A1    Aug. 7, 2014

(30) Foreign Application Priority Data

Oct. 11, 2012    (CN) .......................... 2012 1 0385128

(51) Int. Cl.
*H01L 29/76*    (2006.01)
*H01L 29/66*    (2006.01)
*H01L 29/78*    (2006.01)

(52) U.S. Cl.
CPC ................. *H01L 29/7848* (2013.01); *H01L 29/66636* (2013.01)
USPC .......................................... 257/288; 438/300

(58) Field of Classification Search
CPC .............. H01L 29/0847; H01L 29/165; H01L 29/7848; H01L 29/78; H01L 29/66636
USPC .......................................... 257/288; 438/300
See application file for complete search history.

(56) References Cited

U.S. PATENT DOCUMENTS

| | | | |
|---|---|---|---|
| 7,452,761 B2 * | 11/2008 | Zhu et al. | 438/155 |
| 8,361,847 B2 * | 1/2013 | Johnson et al. | 438/151 |
| 2002/0081793 A1 | 6/2002 | Yang et al. | |
| 2009/0035911 A1 * | 2/2009 | Rachmady et al. | 438/300 |

FOREIGN PATENT DOCUMENTS

| | | |
|---|---|---|
| CN | 101170134 A | 4/2008 |
| CN | 102412202 A | 4/2012 |

* cited by examiner

*Primary Examiner* — Trung Q Dang
(74) *Attorney, Agent, or Firm* — Enshan Hong; VLP Law Group LLP

(57) ABSTRACT

The present invention provides a semiconductor structure comprising a substrate, a gate stack, a sidewall, a base region, source/drain regions, and a support structure, wherein: the base region is located above the substrate, and is separated from the substrate by the void; said support structure is located on both sides of the void, in which part of the support isolation structure is connected with the substrate; the gate stack is located above the base region, said sidewall surrounding the gate stack; said source/drain regions are located on both sides of the gate stack, the base region and the support isolation structure, in which the stress in the source/drain regions first gradually increases and then gradually decreases along the height direction from the bottom. The present invention also provides a manufacturing method for the semiconductor structure. The present invention is beneficial to suppress the short channel effect, as well as to provide an optimum stress to the channel.

20 Claims, 12 Drawing Sheets

SEMICONDUCTOR STRUCTURE AND METHOD OF MANUFACTURING THE SAME

CROSS REFERENCE TO RELATED APPLICATIONS

This application is a national stage application, filed under 35 U.S.C. §371, of PCT Application No. PCT/CN2012/085343, filed on Nov. 27, 2012, entitled "SEMICONDUCTOR STRUCTURE AND MANUFACTURING METHOD for THE SAME", which claimed priority to Chinese Application No. 201210385128.5, filed on Oct. 11, 2012, all of which are hereby incorporated by reference in their entirety.

TECHNICAL FIELD

The present invention relates to the field of semiconductor technology. In particular, the present invention relates to a semiconductor structure and a manufacturing method for the same.

BACKGROUND ART

Industrial demand requires IC circuits to have a higher density, and thereby reduce the size of the MOS transistor. However, the reduction of the size of the MOS transistor results in the emergence of the two well-known parasitic effects, i.e., short channel effect emerging as a result of the reduction of the gate length and drain induced barrier lowering effect, which may easily deteriorate electrical properties of the device, such as reduction of the gate threshold voltage, increase in power consumption, and signal-to-noise ratio (SNR) decline. Physically, the above effects can be explained as follows: when the transistor is turned off (the gate voltage is zero), static electricity impact of the source/drain region in a very small device or the voltage applied to the drain electrode on the channel region reduces the energy barrier of electrons or holes in the channel, and results in a higher turn-off current.

In order to control the short channel effect, more impurity elements such as phosphorus, boron and the like have to be doped in the channel, but which may easily lead to the reduction of the mobility of carries in the device channel; moreover, the distribution of doped impurities in the channel can hardly control the problem of steepness, which may easily result in severe short channel effects; the thickness of gate oxides will also encounter a bottleneck problem of development, the thinning rate in the gate oxide thickness can hardly keep up with the reducing pace of the gate width, and gate dielectric leakage is increasing; critical dimensions continue to shrink, which may easily cause the resistance of the source/region to increase continuously and the power consumption of the device to become greater.

Strained silicon technology can control short channel effects effectively. An MOS transistor with strained silicon as a substrate has been used, which uses the different characteristics of the lattice constant of silicon germanium from monocrystalline silicon to make the epitaxial layer of silicon germanium produce structural strain so as to form strained silicon. Since the lattice constant of the SiGe layer is greater than that of silicon, mechanical stress is generated in the channel region, which causes the carrier mobility to change. In FET, tensile stress can increase the electron mobility, reduce the hole mobility, and can advantageously improve the performance of NMOS; while compressive stress can increase the hole mobility, reduce the electron mobility, and can advantageously improve the performance of PMOS.

However, traditional silicon germanium strained silicon technology also begins to face bottlenecks, which can hardly provide stronger strain to the channel and cannot effectively enhance the performance of the semiconductor device.

SUMMARY OF THE INVENTION

In order to solve the above problems, the present invention provides a semiconductor structure and a manufacturing method for the same, which are conducive to suppressing short channel effect and providing an optimum stress to the channel.

According to one aspect of the present invention, there is provided a manufacturing method for a semiconductor structure, comprising the following steps:
  a) providing a substrate, wherein a first semiconductor layer is formed on the substrate, a second semiconductor layer is formed on the first semiconductor layer, and a gate stack and a first spacer surrounding the gate stack are formed on the second semiconductor layer;
  b) removing the second semiconductor layer on both sides of the gate stack to form a device stack;
  c) forming a second spacer on both sides of the device stack, and removing a portion of the first semiconductor layer on both sides of the device stack to retain the first semiconductor layer of a certain thickness;
  d) in a part of the region of the device stack along the width direction, removing the first semiconductor layer on both sides of the device stack so as to expose the substrate;
  e) in the part of the region along a width direction of the device stack, forming a support isolation structure connected with the substrate below the second spacer and edges of both sides of the device stack;
  f) removing the remaining first semiconductor layer to form a void below the device stack; and
  g) removing the second spacer, and forming source/drain regions on opposite sides of the device stack, wherein stress in the source/drain regions first gradually increases and then gradually decreases along a height direction from the bottom.

According to another aspect of the present invention, there is provided a semiconductor structure comprising a substrate, a gate stack, a sidewall, a base region, source/drain regions, and a support structure, wherein:
  the base region is located above the substrate and is separated from the substrate by a void;
  the support isolation structure is located on both sides of the void, wherein part of the support isolation structure is connected with the substrate;
  the gate stack is located above the base region, the sidewall surrounding the gate stack; and
  the source/drain regions are located on both sides of the gate stack, the base region, and the support isolation structure, wherein the stress in the source/drain regions first gradually increases and then gradually decreases along the height direction from the bottom.

Compared with the prior art, the technical solutions provided by the present invention have the following advantages:
(1) there exists a source/drain region having tapered stress on both sides of the channel, wherein the stress in the source/drain region first gradually increases and then gradually decreases along the height direction from the bottom. As for PMOS devices, the material of the source/drain region is SiGe, wherein the ratio of the Ge element is in the range of 5%-75% and first gradually increases and then gradually decreases along the height direction from the bottom; as for NMOS devices, the material of the source/drain region is SiC, wherein the ratio of the C element is in the range of 0.1%-3% and first gradually increases and then gradually decreases along the height direction from the bottom;

(2) since the channel formed has a small thickness and a void is formed between the channel and the substrate, it is advantageous to suppress the short channel effect; furthermore, since what is below the channel is a void, it is advantageous for the stress in the source/drain region located on both sides of the channel to act on the channel as much as possible, thereby effectively enhancing the influence of stress on the channel carrier mobility and enhance the control effect on channel performance, and thus can better suppress and control the short channel effect.

BRIEF DESCRIPTION OF THE FIGURES

By reading the detailed description of the non-limiting embodiments made with reference to the following figures, the other features, objects and advantages of the present invention will become more apparent.

DESCRIPTION OF THE PREFERRED EMBODIMENTS

The embodiments of the present invention are described in detail below.

Illustrative examples of said embodiments are shown in the figures, wherein the same or similar reference labels denote the same or similar components or components having the same or similar functions. The examples described with reference to the figures below are exemplary, which can be used for explaining the present invention only, and cannot be construed as limiting the present invention. The following disclosure provides many different embodiments or examples used to achieve different structures of the present invention. In order to simplify the disclosure of the present invention, members of specific examples and settings thereof will be described hereinafter. Of course, they are merely exemplary, and are not intended to limit the present invention. In addition, numbers and/or letters in the present invention can be repeated in different examples. Such repetition is for the purpose of simplification and clarity, which itself does not indicate the relationship between the various embodiments and/or settings discussed. Further, the present invention provides examples of a variety of particular processes and materials, but those skilled in the art may be aware of the applicability of other processes and/or the use of other materials. In addition, the structure where the first feature is "above" the second feature described below may include an embodiment where the first and second features are formed as a direct contact, and may also include an embodiment where additional features are formed between the first and second features, so that the first and second features may not be in direct contact.

Figure 12:
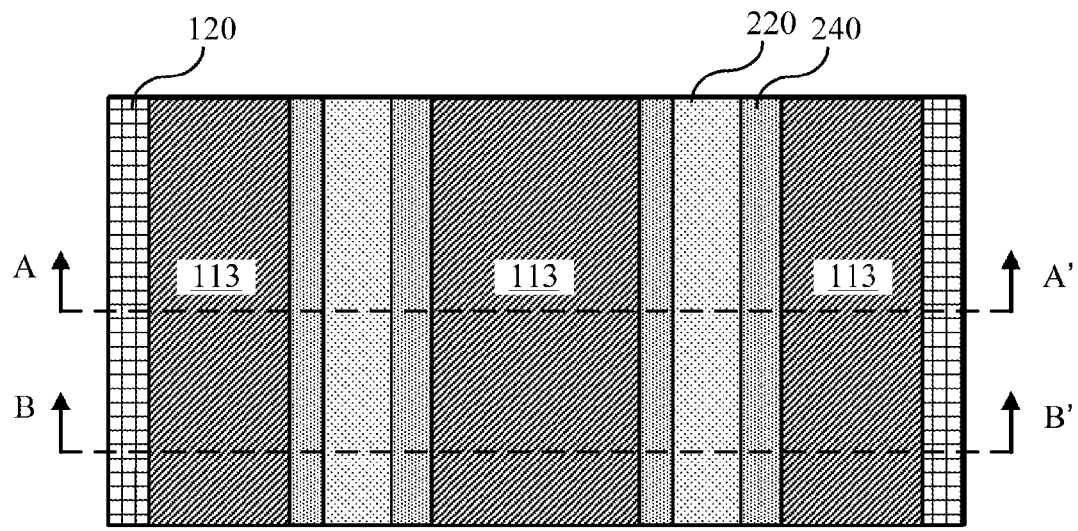
FIG. 12 is a schematic top view after forming a source/drain region having stress on both sides of the gate stack.
Figure 12A:
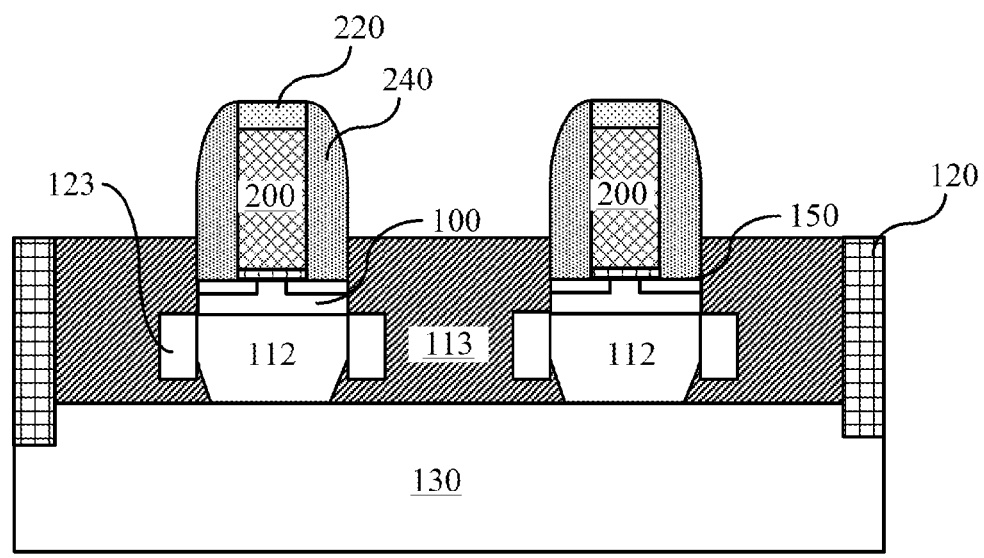
FIGS. 12a and 12b are schematic cross-sectional views of FIG. 12 along the sectional line AA' and along the sectional line BB', respectively.
Figure 12B:
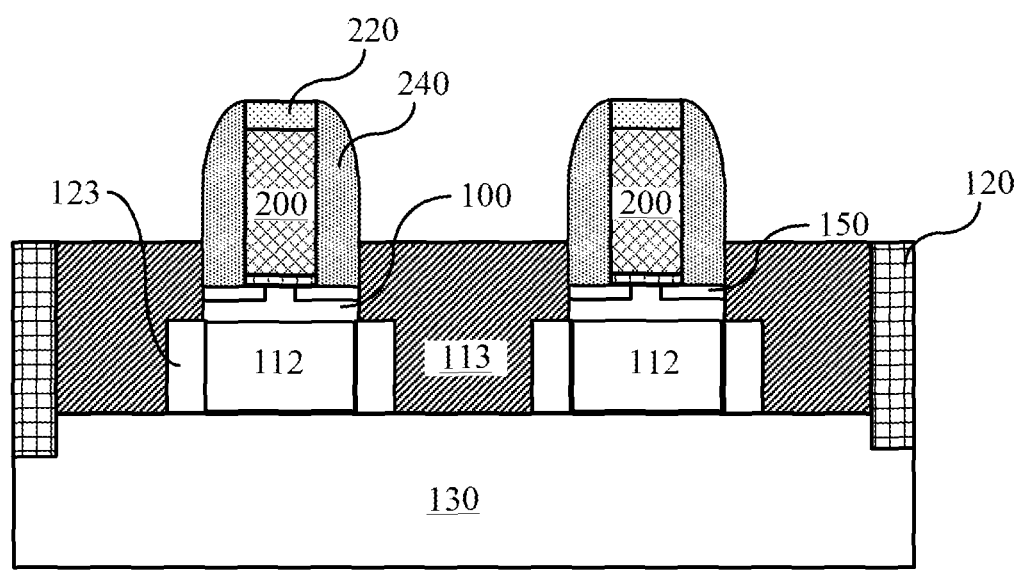

According to one aspect of the present invention, there is provided a semiconductor structure (please refer to FIG. 12, FIG. 12a and FIG. 12b), wherein FIG. 12 is a schematic top view of the semiconductor structure, and FIGS. 12a and 12b are schematic top views of FIG. 12 along the sectional line AA' and the sectional line BB', respectively. As shown in the figures, the semiconductor structure comprises a substrate 130, a gate stack, a spacer 240, a base region 100, a source/drain region, and a support structure 123, wherein the base region 100 is located above the substrate 130 and is isolated from the substrate 130 by a void 112; the support isolation structure 123 is located between the base region 100 and the substrate 130, wherein part of the support isolation structure 123 is connected with the substrate 130; the gate stack is located above the base region 100, said spacer 240 surrounds the gate stack; the source/drain region is located on both sides of the gate stack, the base region 100 and the support isolation structure 123, wherein the stress in the source/drain region first gradually increases and then gradually decreases along the height direction from the bottom.

Specifically, in the present embodiment, the material of the substrate 130 is a monocrystalline Si; in other embodiments, the material of the substrate 130 may be a polycrystalline Si, polycrystalline Ge, polycrystalline SiGe, amorphous Si, amorphous Ge, amorphous SiGe, Group III-V or II-VI compound semiconductor, or any combination thereof. The substrate 130 has a thickness in the range of 0.1 nm to 2 mm.

The base region 100 is located above the substrate 130, and is isolated from the substrate 100 by a void 112. The channel of the semiconductor structure is formed in the base region 100. In the present embodiment, the material of the base region 100 is monocrystalline silicon; in other embodiments, the material of the base region 100 may also be any other suitable semiconductor material. The base region 100 has a thickness in the range of 10 nm to 30 nm.

The support isolation structure 123 is located on both sides of the void 112, and its purpose is to make the gate stack with a spacer 240 and the base region 100 suspend above the substrate 130. Part of the support isolation structure 123 is connected with the substrate 130, i.e., there is a certain distance between part of the support isolation structure 123 and the substrate 130, i.e., they are not in direct contact. In the present embodiment, the material of the support isolation structure 123 is the same as that of the substrate 130 and the base region 100, i.e., monocrystalline Si; in other embodiments, the material of the support isolation structure 123 material may also be any other suitable semiconductor material.

The gate stack includes a gate dielectric layer 102, a gate 200 and a cap layer 220, wherein the gate dielectric layer 102 is located above the base region 100, the gate 200 is located above the gate dielectric layer 102, the cap layer 220 is located above the gate 200, to protect the gate 200 from being damaged in the subsequent steps. The material of the gate electrode 200 can be selected from Poly-Si, Ti, Co, Ni, Al, W, alloys, metal silicides, and combinations thereof. The gate dielectric layer 102 may be a thermal oxide layer including silicon oxide and silicon oxynitride, and can also be a high K dielectric, such as one of $HfO_2$, HfSiO, HfSiON, HMO, HMO, HfZrO, $Al_2O_3$, $La_2O_3$, $ZrO_2$, LaAlO, or a combination thereof. The gate dielectric layer 220 may have a thickness of 2 nm to 10 nm, for example, 5 nm or 8 nm. For example, one of TaC, TiN, TaTbN, TaErN, TaYbN, TaSiN, HfSiN, MoSiN, RuTax, NiTa, or any combination thereof can be deposited. The cap layer 220 may be selected from silicon nitride and has a thickness in the range of 10 nm to 40 nm, for example, 10 nm or 20 nm. The spacer 240 surrounds the sidewalls of the gate dielectric layer 102, the gate 200 and the cap layer 220. The material of the spacer 240 comprises one of silicon nitride, silicon oxide, silicon oxynitride, silicon carbide, and any combination thereof, and/or other suitable materials. The spacer 240 may be a monolayer structure, or may have a multilayer structure. The spacer 240 has a thickness in the range of 10 nm to 100 nm, for example, 30 nm, 50 nm or 80 nm.

The source/drain region is located on both sides of the gate stack with a spacer 240, the base region 100 and the support isolation structure 123. The upper surface of the source/drain region is preferably higher than or at the same level as the bottom of the gate stack. In the present embodiment, when the semiconductor structure is a PMOS device, the material of the substrate 130 is monocrystalline Si, and the material of the source/drain region is SiGe, wherein the proportion of the Ge element is within the range of 5%-75% and first gradually increases and then gradually decreases along the height direction from the bottom, so that the stress in the channel region of the PMOS device is maximized; when the semiconductor structure is an NMOS device, the material of the substrate 130 is monocrystalline Si, and the material of the source/drain region is Si:C, wherein the proportion of the element C is within the range of 0.1%-3% and first gradually increases and then gradually decreases along the height direction from the bottom, so that the stress in the channel region of the NMOS device is maximized. It should be noted that the portion where the support structure 123 and the substrate 130 are not in direct contact, SiGe or Si:C is sandwiched therebetween.

Preferably, the semiconductor structure provided in the present invention further comprises a source/drain extension region 150, which is located in the part of the base region 100 adjacent to the source/drain region.

The semiconductor structure provided in the present invention has the following advantages:

(1) forming a source/drain region having tapered stress on both sides of the channel, wherein the stress in the source/drain region first gradually increases and then gradually decreases along the height direction from the bottom, so that the stress in the device channel region is maximized; and (2) since the channel formed has a small thickness and a void is formed between the channel and the substrate, it is advantageous to suppress the short channel effect; furthermore, since what is below the channel is a void, it is advantageous for the stress in the source/drain region located on both sides of the channel to act on the channel as much as possible, thereby effectively enhancing the influence of stress on the channel carrier mobility and enhance the control effect on channel performance, and thus can better suppress and control the short channel effect.

Figure 1:
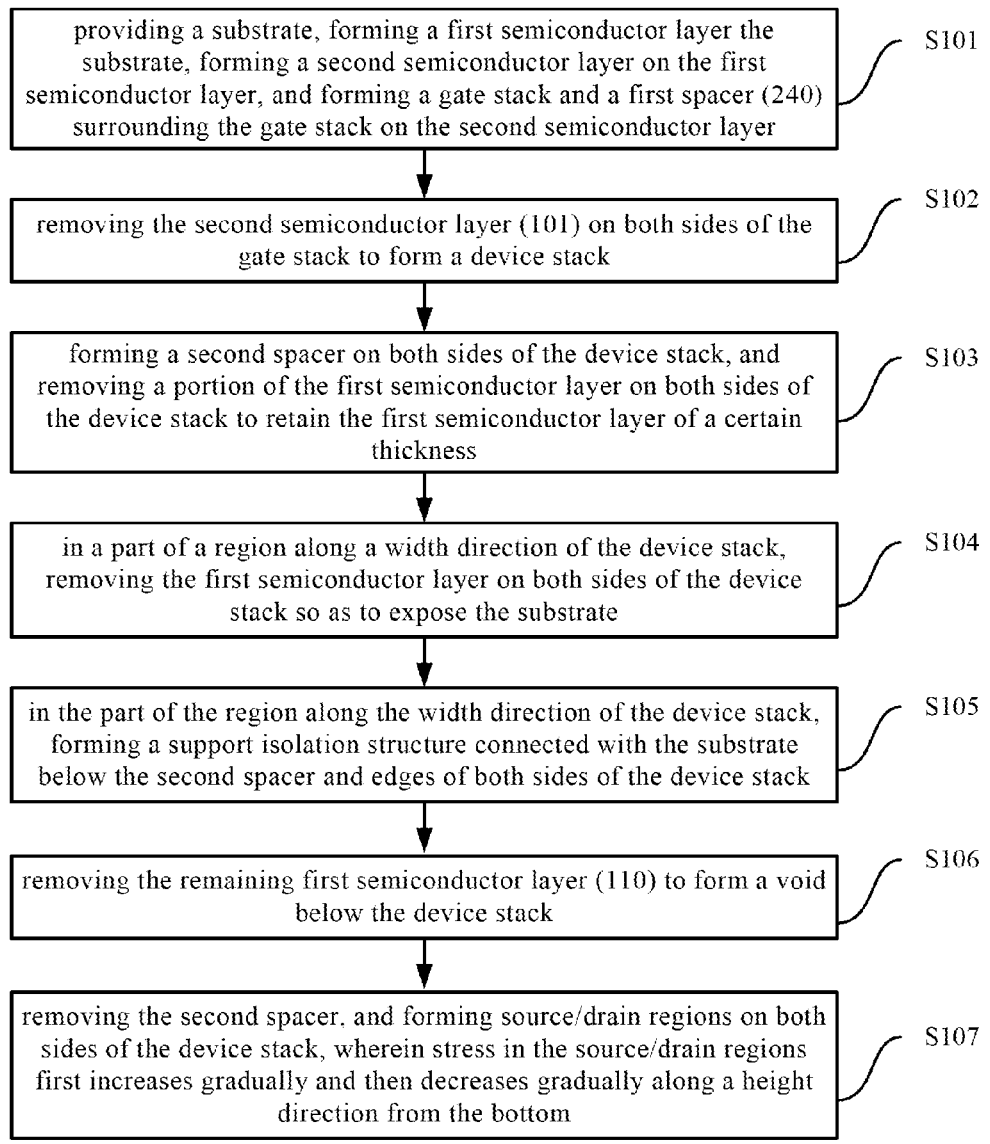
FIG. 1 is a flowchart of the manufacturing method for a semiconductor structure according to the invention.
Figure 2:
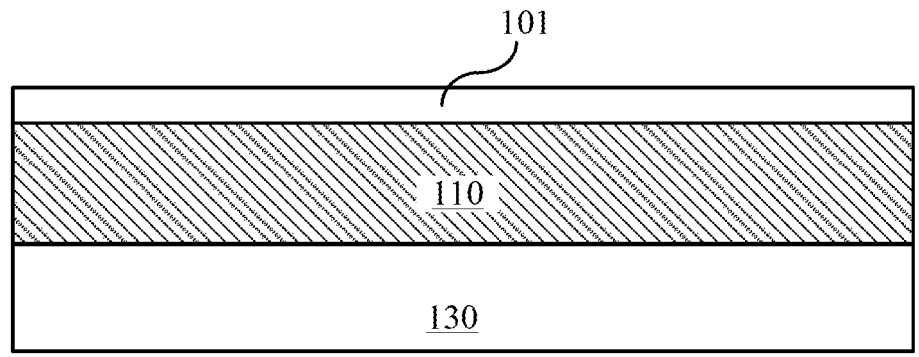
FIG. 2 is a schematic cross-sectional view after providing a substrate and forming a first semiconductor layer and a second semiconductor layer thereon.

According to another aspect of the present invention, there is further provided a manufacturing method for a semiconductor structure. The method of forming a semiconductor structure of FIG. 1 is described in detail below through one embodiment of the present invention in combination with FIG. 2 to FIG. 12b. As shown in FIG. 1, the manufacturing method provided by the present invention comprises the following steps:

In step S101, providing a substrate 130, wherein a first semiconductor layer 110 is formed on the substrate (130) first, then a second semiconductor layer 101 is formed on the first semiconductor layer (110), and a gate stack as well as a first spacer (240) surrounding the gate stack are formed on the second semiconductor layer (101);

Specifically, as shown in FIG. 2, there is provided a substrate 130, wherein in the present embodiment, the material of the substrate 130 is monocrystalline Si; in other embodiments, the material of the substrate 130 may also be polycrystalline Si, polycrystalline Ge, polycrystalline SiGe, amorphous Si, amorphous Ge, amorphous SiGe, Group III-V or II-VI compound semiconductor or any combination thereof. The substrate 130 has a thickness in the range of 0.1 nm to 2 mm.

A first semiconductor layer 110 is deposited on the substrate 130, wherein the material of the first semiconductor layer 110 is different from that of the substrate 130. In the present embodiment, the material of the first semiconductor layer 110 is preferably SiGe, wherein the proportion of Ge is 5%-15%, and the first semiconductor layer 110 has a thickness in the range of 20 nm to 60 nm.

A thin second semiconductor layer 101 is deposited on the first semiconductor layer 110, wherein the second semiconductor layer 101 in the subsequent steps will be used for forming a channel region. In the present embodiment, the material of the second semiconductor layer 101 is monocrystalline silicon with a thickness in the range of 10 nm to 30 nm. In other embodiments, the material of the second semiconductor layer 101 may also be a material other than the first semiconductor layer 110.

Figure 3:
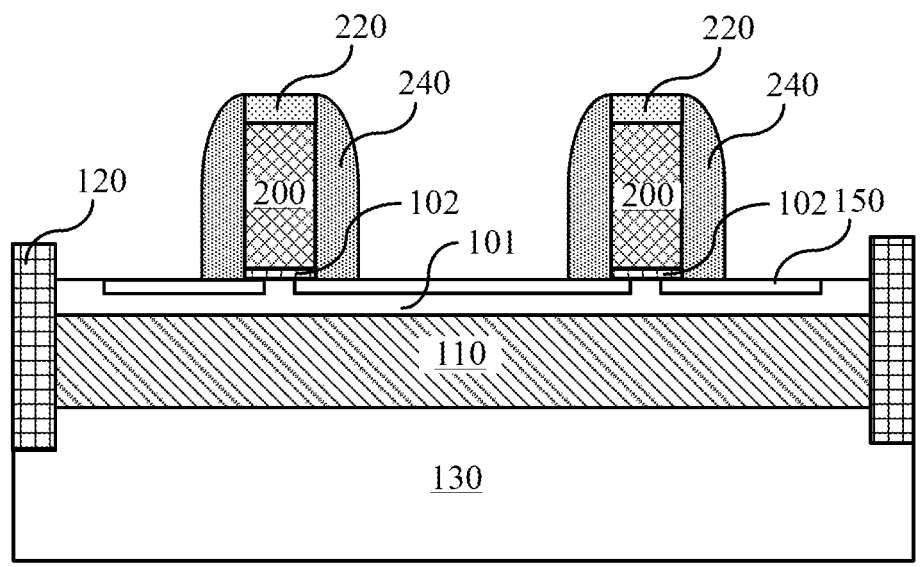
FIG. 3 is a schematic cross-sectional view after forming a gate stack and a first spacer.

Next, as shown in FIG. 3, an isolation region is formed in the substrate 130, the first semiconductor layer 110 and the second semiconductor layer 101, for example, a shallow trench isolation (STI) structure 120, so as to electrically isolate the continuous semiconductor device. Then, a gate stack constituted by a gate dielectric layer 102, a gate 200 and a cap layer 220 is formed on the second semiconductor layer 101, wherein the gate 200 is located on the gate dielectric layer 102 and the cap layer 220 is located above the gate 200, to protect the gate 200 from being damaged in the subsequent steps. The material of the gate electrode 200 can be selected from Poly-Si, Ti, Co, Ni, Al, W, alloys, metal silicides, and combinations thereof. The gate dielectric layer 102 may be a thermal oxide layer including silicon oxide and silicon oxynitride, and can also be a high K dielectric, such as one of $HfO_2$, HfSiO, HfSiON, HMO, HfTiO, HfZrO, Al$_2$O$_3$, La$_2$O$_3$, ZrO$_2$, LaAlO, or any combination thereof. The gate dielectric layer 220 may have a thickness of 2 nm to 10 nm, for example, 5 nm or 8 nm. For example, one of TaC, TiN, TaTbN, TaErN, TaYbN, TaSiN, HfSiN, MoSiN, RuTax, NiTa, or any combination thereof can be deposited. The cap layer 220 may be selected from silicon nitride and has a thickness in the range of 10 nm to 40 nm, for example, 10 nm or 20 nm. After forming a gate stack, the surface of the second semiconductor layer 101 located on both sides of the gate stack is lightly doped for forming a source/drain extension region 150. As for PMOS devices, P-type impurities, such as boron and indium, are doped into the second semiconductor layer 101; as for NMOS devices, N-type impurities, such as arsenic and phosphorus, are doped in the second semiconductor layer 101. After forming a source/drain extension region 150, a first spacer 240 surrounding the sidewalls of the gate dielectric layer 102, the gate 200 and the cap layer 220 is formed. The material of the first spacer 240 comprises one of silicon nitride, silicon oxide, silicon oxynitride, silicon carbide, or any combination thereof, and/or other suitable materials. The spacer 240 may be a monolayer structure, or may also have a multilayer structure. The spacer 240 has a thickness in the range of 10 nm to 100 nm, for example, 30 nm, 50 nm or 80 nm.

In step S102, the second semiconductor layer 101 located on both sides of the gate stack is removed to form a device stack.

Figure 4:
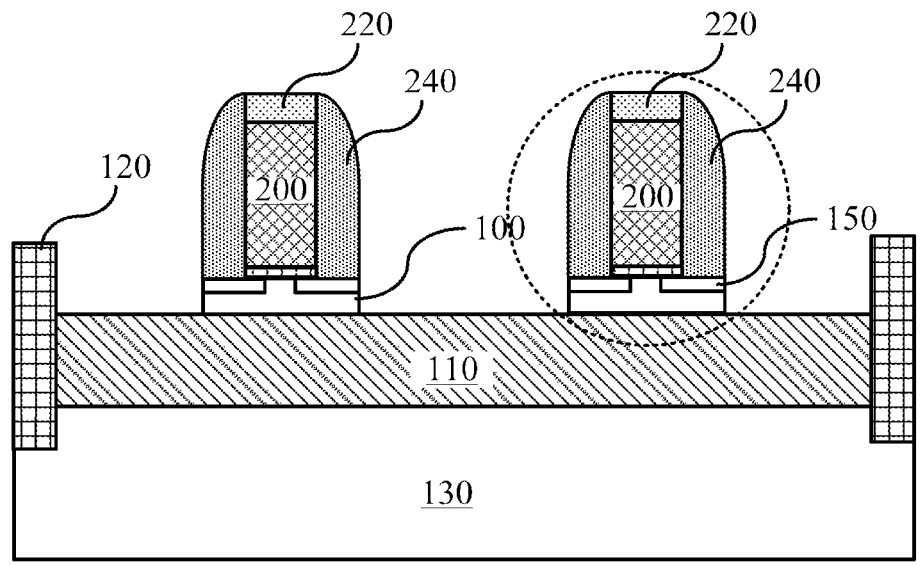
FIG. 4 is a schematic cross-sectional view after removing the second semiconductor layer on both sides of the gate stack.

Specifically, as shown in FIG. 4, the gate stack with a spacer 240 is used as a mask and the first semiconductor layer 110 is used as a stop layer to etch and remove the second semiconductor layer 101 on both sides of the gate stack to form a device stack, wherein the second semiconductor layer 101 located below the gate stack and the first spacer 240 is formed into a base region 100 after etching. As shown in the portion circles by the dash line in FIG. 4, the device stack comprises a gate stack, a spacer 240 and a base region 100 located below the gate stack and the first spacer 240. The etching is preferably dry etching, said dry etching method comprising plasma etching, ion milling, reverse sputtering, and reactive ion etching. In the present embodiment, reactive ion etching is employed.

In step S103, a second spacer 260 is formed on both sides of the device stack and part of the first semiconductor layer 110 on both sides of the device stack is removed, where a first semiconductor layer 110 having a certain thickness is retained.

Figure 5:
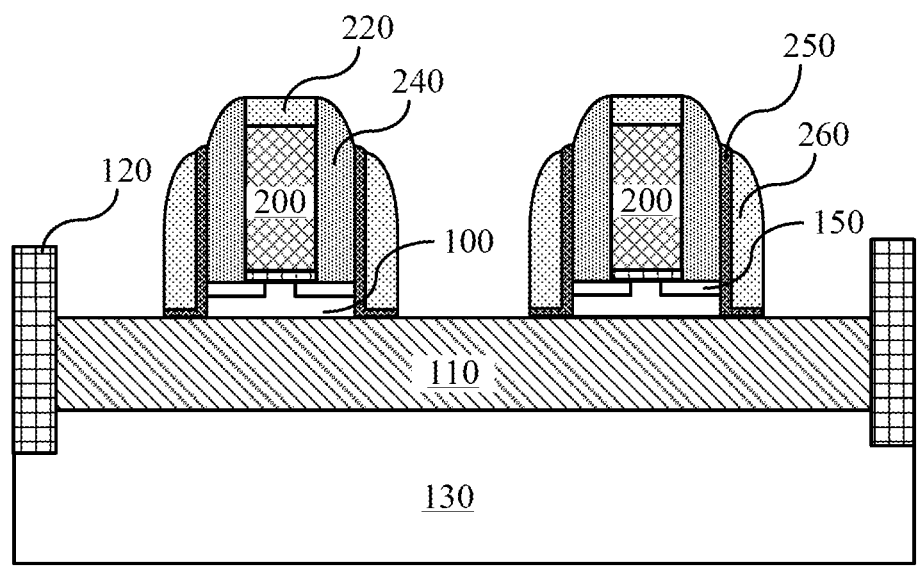
FIG. 5 is a schematic cross-sectional view after forming a stop layer and a second spacer on the side surfaces of the first spacer and the base region.

Specifically, as shown in FIG. 5, first, a stop layer 250 surrounding the first spacer 240 and the sidewalls of the base region 100 is formed, and a second spacer 260 surrounding the stop layer 250 is formed, wherein the material of the second spacer 260 comprises one of silicon nitride, silicon oxide, silicon oxynitride, silicon carbide, or any combination thereof, and/or other suitable materials, its thickness being in the range of 5 nm to 10 nm; the material of the stop layer 250 is preferably an insulating material different from the first spacer 240 and the second spacer 260, for example, the material of the first spacer 240 and the second spacer 260 is silicon nitride, while the material of the stop layer 250 is silicon oxide. The stop layer 250 has a thickness in the range of 1 nm to 3 nm.

Figure 6:
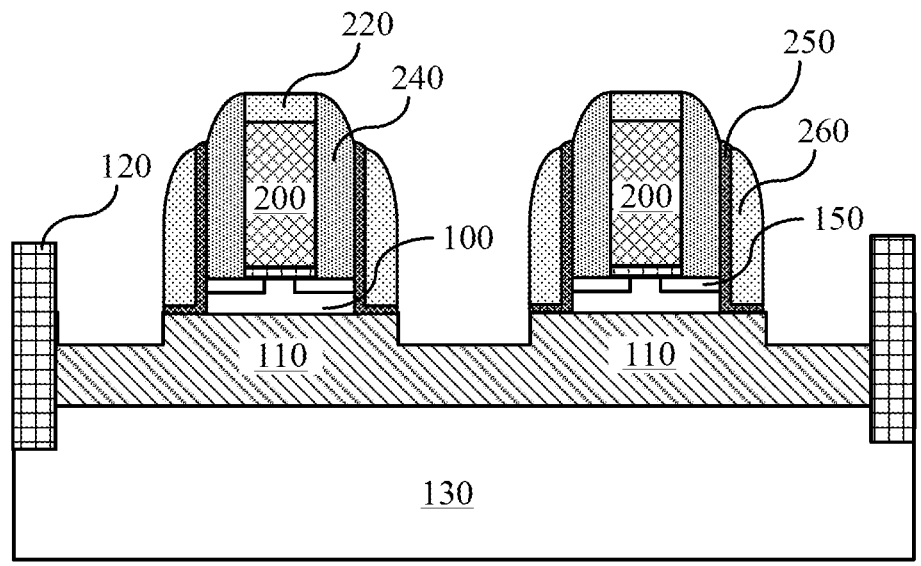
FIG. 6 is a schematic cross-sectional view after etching a part of the first semiconductor layer.

Subsequently, as shown in FIG. 6, the device stack with a second spacer 260 is used as a mask, and means such as dry etching is employed to etch the first semiconductor layer 110 located on both sides of the second spacer 260. During the etching process, the first semiconductor layer 110 is not completely removed, but the first semiconductor layer 110 with a certain thickness is still retained on both sides of the second spacer 260.

In step S104, in a part of the region of the device stack along the width direction, part of the first semiconductor layer 110 located on both sides of the device gate is removed so as to expose the substrate 130.

Figure 7:
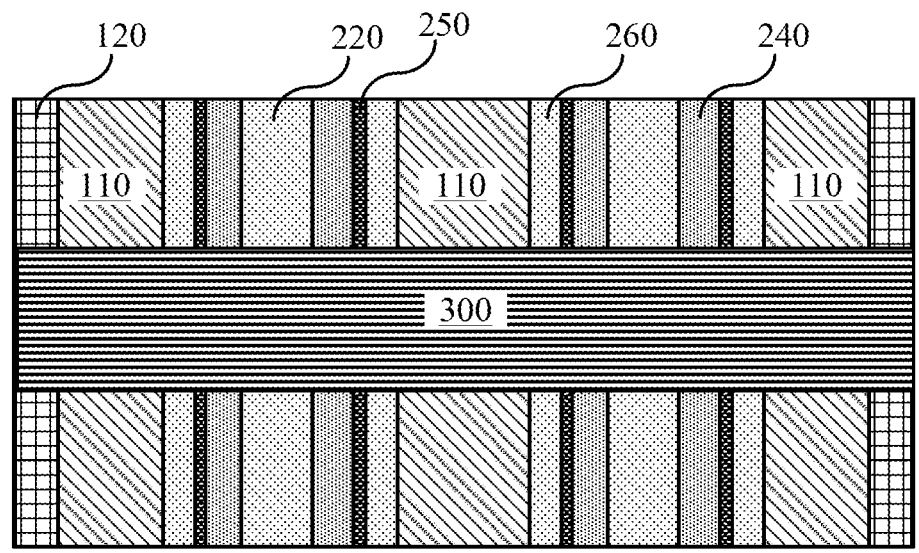
FIG. 7 is a schematic top view after covering a photoresist.

Specifically, in the present embodiment, as shown in FIG. 7, a photolithographic mask 300 is formed on the semiconductor structure to cover the intermediate portion and expose the terminal portion of the semiconductor structure in the width direction, so that the first semiconductor layer 110 below the photolithographic mask 300 is not etched in the subsequent steps. It should be noted that the width direction of the semiconductor structure is relative to the channel length direction of the semiconductor structure. The material of the photolithographic mask 300 may be a photoresist, an organic polymer, silicon oxide, silicon nitride, borosilicate glass, borophosphosilicate glass, and a combination thereof. The method of forming a photolithographic mask 300 is a well known process to those skilled in the art. For the sake of brevity, no further comment is made. The function of the photolithographic mask 300 is to protect part of the first semiconductor layer 110 in the intermediate portion in the width direction of the semiconductor structure and on both sides of the device stack. That is, after etching the first semiconductor layer 110 not covered by the photolithographic mask 300 in the subsequent steps, the part of the first semiconductor layer 110 located in the intermediate portion in the width direction of the semiconductor structure and on both sides of the device stack is left. As will be described below, the position of the photolithographic mask 300 is not only limited to the position as shown in FIG. 7. Any photolithographic mask 300 that can cover the first semiconductor layer 110 located on both sides of the gate stack in the part of region in the width direction of the semiconductor structure is suitable for the manufacturing method provided by the present invention, which is not illustrated one by one herein.

Figure 8:
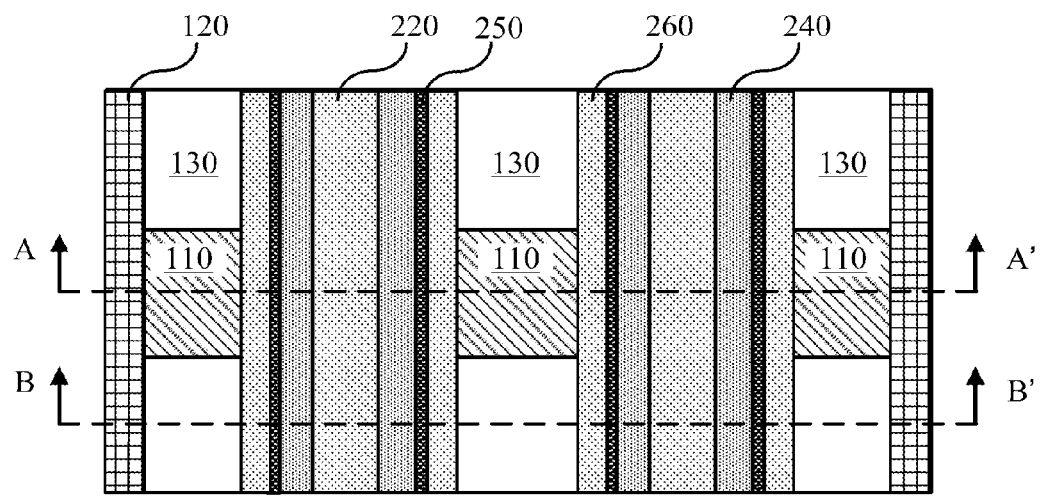
FIG. 8 is a schematic top view after etching the first semiconductor layer so as to expose part of the substrate.
Figure 8A:
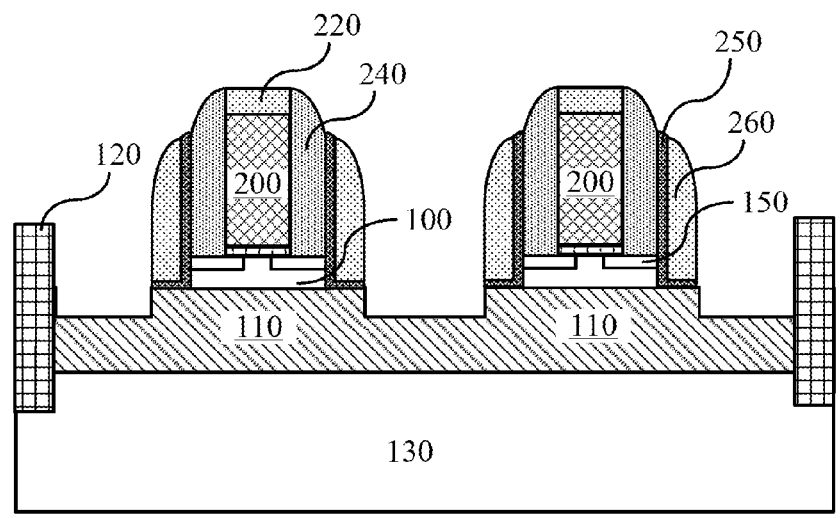
FIGS. 8a and 8b are schematic cross-sectional views of FIG. 8 along the sectional line AA' and along the sectional line BB', respectively.
Figure 8B:
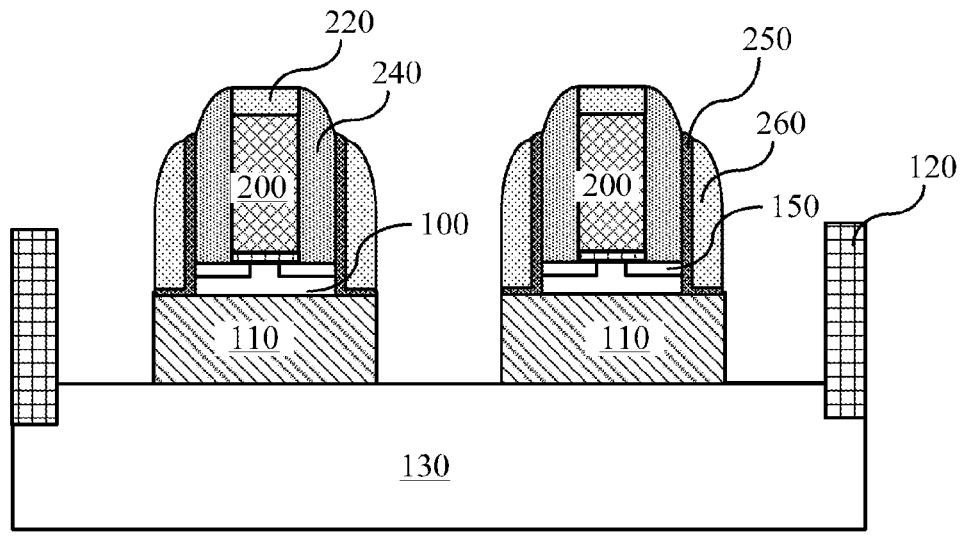

As shown in FIG. 8, the photolithographic mask 300 and the device stack with a second spacer 260 are used as a mask and the substrate 130 is used as an etching stop layer, to etch the first semiconductor layer 110 outside the device stack and the second spacer 260 in the two terminal regions in the width direction of the device stack (in other embodiments, in the region not covered by the photolithographic mask 300 in the width direction of the device stack) until the substrate 130 is exposed. Then, the photolithographic mask 300 is removed. Please refer to FIG. 8a and FIG. 8b, which are schematic sectional views of FIG. 8 along the sectional line AA' and along the sectional line BB', respectively. As shown in FIG. 8a, the second semiconductor layer 110 in the intermediate portion in the width direction of the semiconductor structure, and on both sides of the second spacer 260 and covered by the photolithographic mask 300 is retained, while the second semiconductor layer 110 in the two terminal regions in the width direction of the semiconductor structure, on both sides of the spacer 260 and not covered by the photolithographic mask 300 is removed, where the substrate 130 below is exposed, as shown in FIG. 8b.

In step S105, in the part of region in the width direction of the device stack, a support isolation structure 123 connected with the substrate is formed below the edges of the spacer 260 and the two sides of the device stack.

Figure 9:
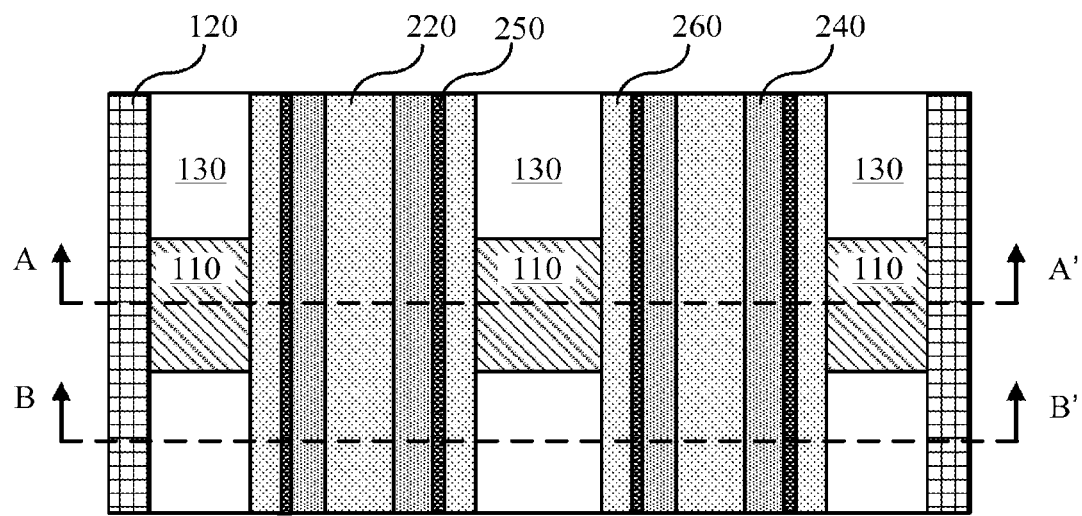
FIG. 9 is a schematic top view after lateral selective etching of the second semiconductor layer.
Figure 9A:
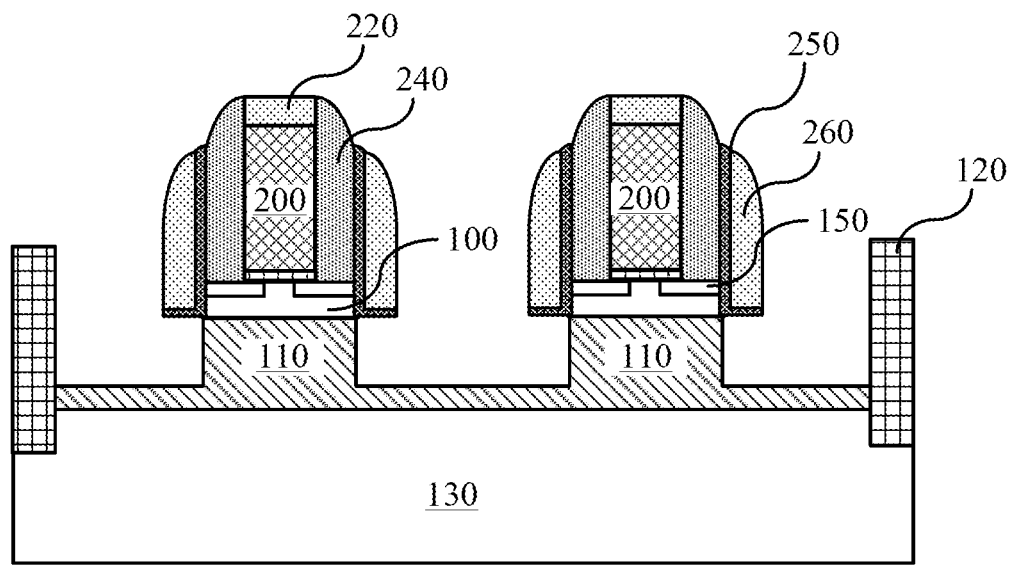
FIGS. 9a and 9b are schematic cross-sectional views of FIG. 9 along the sectional line AA' and along the sectional line BB', respectively.
Figure 9B:
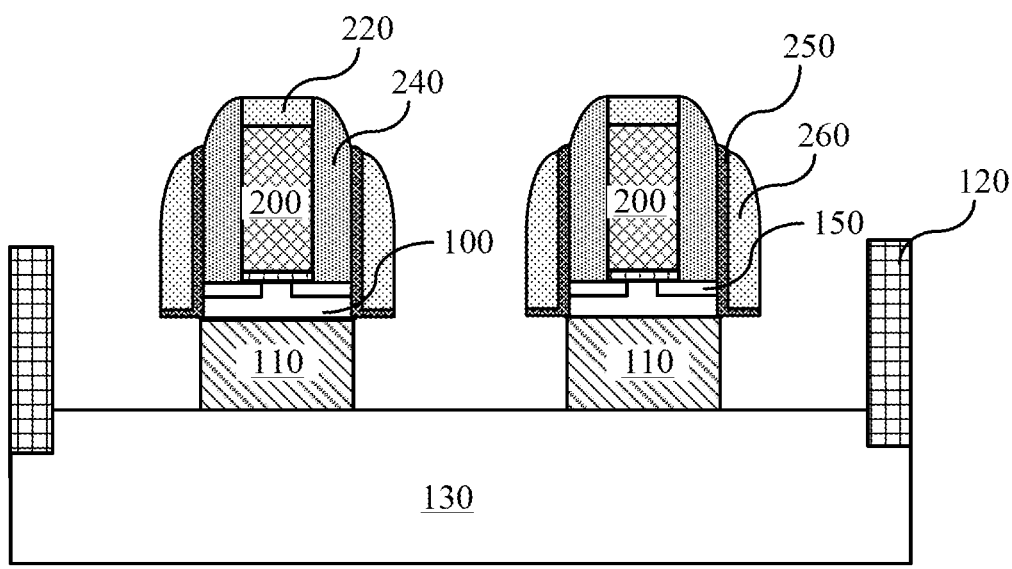

Specifically, as shown in FIG. 9, FIG. 9a and FIG. 9b, wherein FIGS. 9a and 9b are schematic sectional views of FIG. 9 along the section line AA' and along the sectional line BB', respectively. As shown in the figures, the first semiconductor layer 110 located below the gate stack and the second spacer 260 is back etched, and by controlling the etching time, the lateral etching distance is slightly greater than the sum of the thickness of the second spacer 260 and the stop layer 250.

Figure 10:
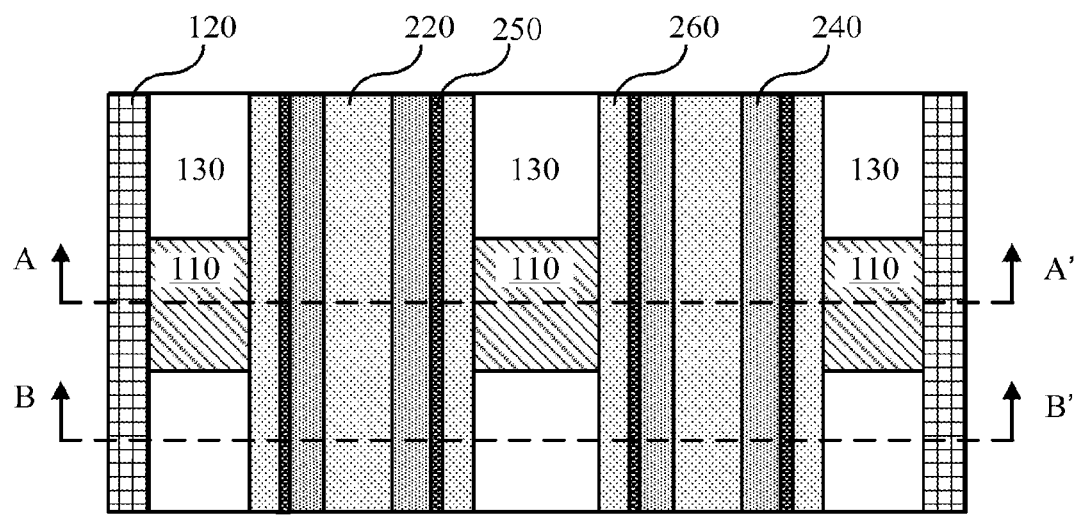
FIG. 10 is a schematic top view after forming a support isolation structure.
Figure 10A:
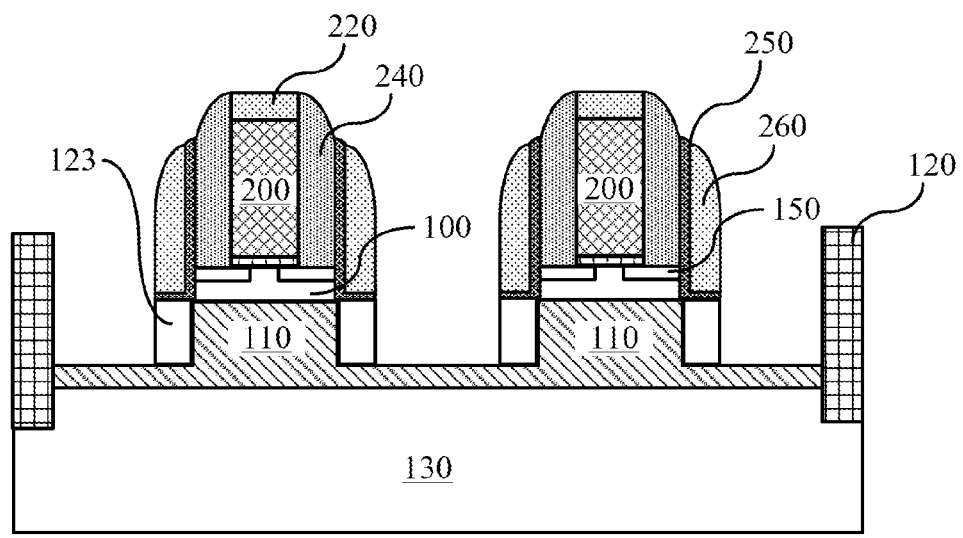
FIGS. 10a and 10b are schematic cross-sectional views of FIG. 10 along the sectional line AA' and along the sectional line BB', respectively.
Figure 10B:
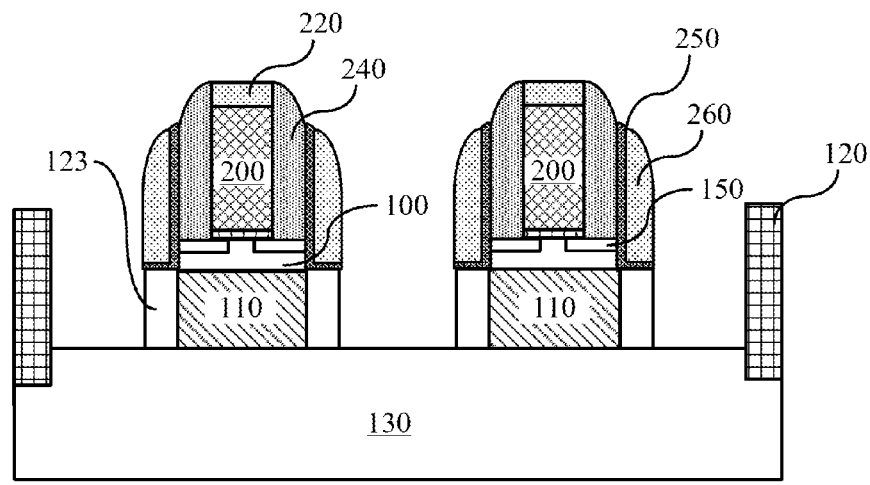

Next, as shown in FIG. 10, FIG. 10a and FIG. 10b, wherein FIGS. 10a and 10b are schematic sectional views of FIG. 10 along the section line AA' and along the sectional line BB', respectively. As shown in the figures, for example, the surface of the semiconductor exposed by a method such as epitaxial growth is formed in to a third semiconductor layer (not shown), and the third semiconductor layer exposed in the vertical direction is removed by anisotropic etching (e.g. RIE, etching is performed essentially in the vertical direction only), while the third semiconductor layer below the device stack with a spacer 260 (mainly below the second spacer 260) is retained, so as to form a support isolation structure 123. Laterally, the support isolation structure 123 is located substantially below the spacer 260 and the edges of the two sides of the device stack. In the present embodiment, the material of the support isolation structure 123 is monocrystalline silicon; in other embodiments, the support material of the isolation structure 123 may also be any other semiconductor material different from the first semiconductor layer 110. As shown in FIG. 10a, since in the intermediate portion in the width direction of the semiconductor structure, the first semiconductor layer 110 is not etched completely under the protection of the photolithographic mask 300 (please refer to FIG. 8), when a support isolation structure 123 is formed on the sidewalls of the first semiconductor layer 110 covered previously by the photolithographic mask 300, the support isolation structure 123 is formed on the first semiconductor layer 110, i.e., there is a first semiconductor layer 110 between the support isolation structure 123 and the substrate 130. However, as shown in FIG. 11b, in the two terminal regions in the width direction of the semiconductor structure not protected by the photolithographic mask 300, etching stops at the surface of the substrate 130. Thus, while forming the support isolation structure 123, there is no first semiconductor layer 110 below, i.e., the support isolation structure 123 is directly formed on the substrate 130 and is connected with the substrate 130. Although the present embodiment illustrates the example where a support isolation structure 123 is formed in the two terminal regions in the width direction of the semiconductor structure, those skilled in the art shall understand that the specific position of the support isolation structure 123 is not limited to this. For example, those skilled in the art may understand that as long as it is connected with the substrate, the object of forming a void can be achieved and the device stack can be supported, the support isolation structure 123 can be located at any position in the width direction of the semiconductor structure. For the sake of simplicity, no further comment is made herein.

In step S106, the remaining first semiconductor layer 110 is removed and a void 112 is formed below the device stack.

Figure 11:
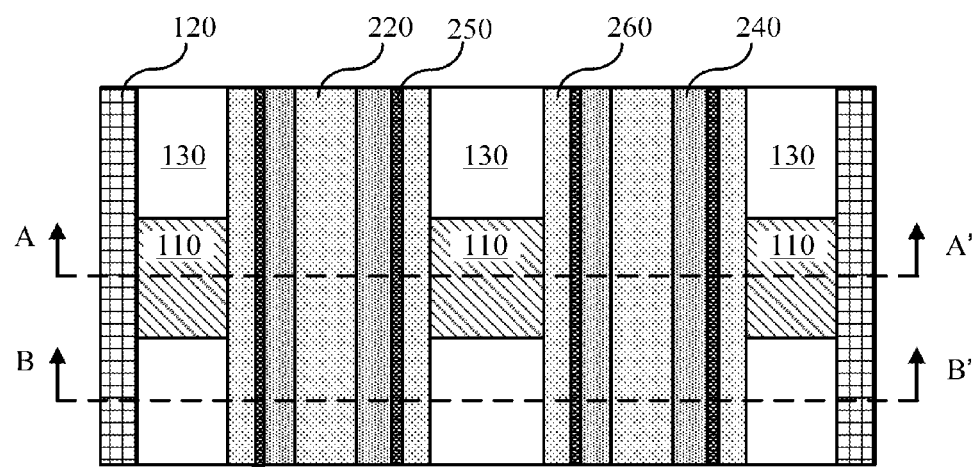
FIG. 11 a schematic top view after removing a second semiconductor layer to form a void below the gate stack.
Figure 11A:
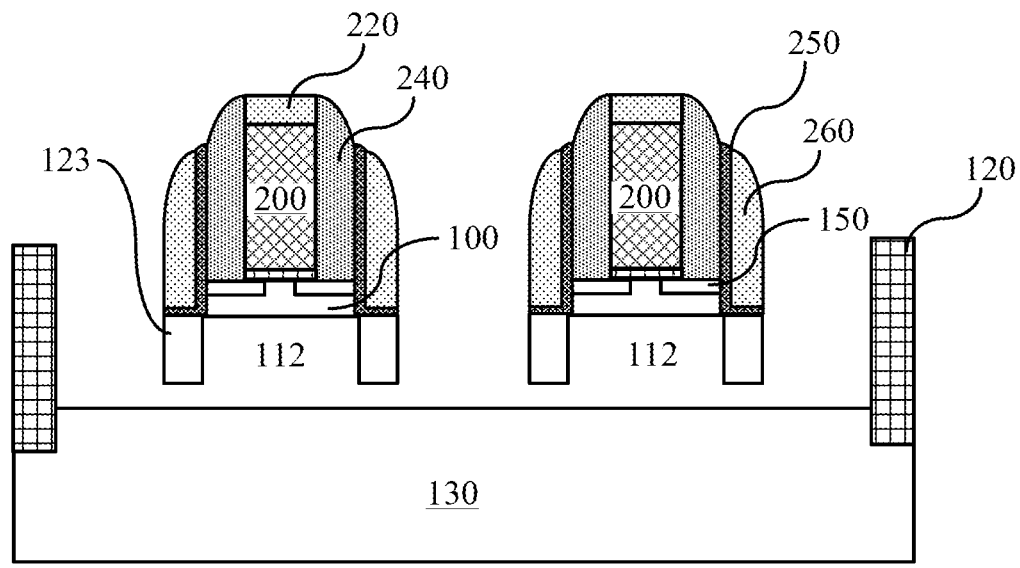
FIGS. 11a and 11b are schematic cross-sectional views of FIG. 11 along the sectional line AA' and along the sectional line BB', respectively.
Figure 11B:
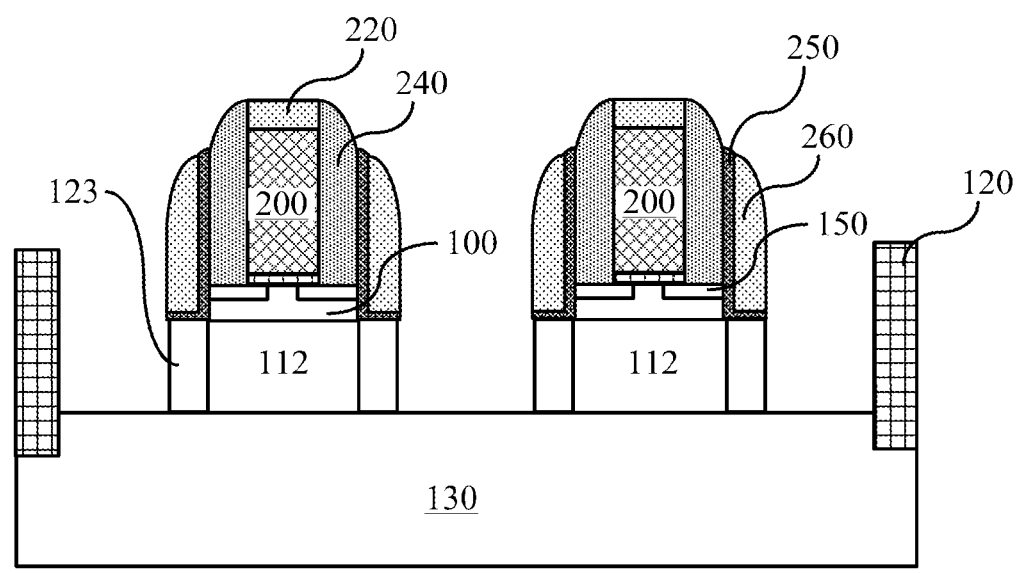

Specifically, as shown in FIG. 11, FIG. 11a and FIG. 11b, wherein FIG. 11a and FIG. 11b are schematic sectional views of FIG. 11 along the sectional line AA' and along the sectional line BB', respectively. As shown in the figures, wet etching is utilized to selectively remove the remaining first semiconductor layer 110 and form a 112 below the device stack. As the material of the first semiconductor layer 110 is different from that of the substrate 130, the base region 101 and the support structure 123, the remaining first semiconductor layer 110 can be removed only by selecting a corresponding corrosion solution. The corrosion solution first corrodes the first semiconductor layer 110 located outside the support isolation structure 123, and then removes the first semiconductor layer 110 located between the support isolation structure 123 and the substrate 130. At this time, in the intermediate portion in the width of the semiconductor structure, a gap is formed between the support isolation structure 123 and the substrate 130, the corrosion solution continues to corrode the first semiconductor layer 110 below the device stack through the gap, until all of the first semiconductor layer 110 is completely removed, where a void 112 is formed below the device stack. At this time, as shown in FIG. 11a, as for the region where a first semiconductor layer previously exists between the support isolation structure 123 and the substrate 130, after the first semiconductor layer 110 is removed, a gap is formed between the support isolation structure 123 and the substrate 130; as shown in FIG. 11b, as for the region where a first semiconductor layer previously does not exist between the support isolation structure 123 and the substrate 130, the support isolation structure 123 is connected with the substrate 130, so as to support the device stack to allow the device stack suspend above the substrate 130.

In step S107, the second spacer 260 is removed, and a source/drain region is formed on both sides of the device stack, wherein the stress in the source/drain region first gradually increases and then gradually decreases along the height direction from the bottom.

Specifically, as shown in FIG. 12, FIGS. 12a and 12b, wherein FIG. 12a and FIG. 12b are schematic sectional views of FIG. 12 along the sectional line AA' and along the sectional line BB', respectively. As shown in the figures, first, the stop layer 250 is used as an etching stop layer to remove the second spacer 260 by dry etching; then, the first spacer 240 is used as an etching stop layer to continue to remove the stop layer 250 by dry etching so as to expose the device stack; at this time, the device stack is connected with the substrate 130 through the support isolation structure 123; then, the recess on both sides of the device stack is filled by epitaxial growth to form a material layer 113 and the material layer 113 is heavily doped to form a source/drain region. As for PMOS devices, P-type impurities, such as boron and indium, are doped into the material layer 113; as for NMOS devices, N-type impurities, such as arsenic and phosphorus, are doped into the material layer 113. During the process of epitaxial growth, due to the presence of the support isolation structure 123, the filling materials are substantially present outside the support isolation material 123 so as to ensure that the void 112 is not filled. As shown in FIG. 12a, in the region where the support isolation structure 123 does not directly contact the substrate 130, since there exists a certain gap between the support isolation structure 123 and the substrate 130, a small amount of filing materials will enter into the void 112 from the gap, but the small amount of filling materials, after entering into the gap, are accumulated to form a barrier, as a result of which, only some of the filling materials enter into the void 112, while a majority of the filling materials are isolated out; as shown in FIG. 12b, in the region where the support isolation structure 123 is connected with the substrate 130, the filling materials are completely blocked outside the void 112 by the support isolation structure 123. Preferably, as for PMOS devices, the filling material is boron-doped silicon-germanium (SiGe), which can produce compressive stress on the channel region of the PMOS device, wherein in order to maximize the stress in the channel region of the PMOS device, during the process of epitaxial growth, the proportion of the Ge element needs to be maintained within the range of 5%-75%, and is gradually increased first and then gradually reduced in the direction from the bottom; as for NMOS devices, the filling material is phosphorus or arsenic-doped silicon-carbon (Si:C), which can produce compressive tension in the channel region of the NMOS device, wherein in order to maximize the stress in the channel of the NMOS device, during the process of epitaxial growth, the proportion of the C element needs to be maintained within the range of 0.1%-3%, and is gradually increased first and then gradually reduced in the direction from the bottom.

Compared with the prior art, the manufacturing method for provided by the present invention has the following advantages:

(1) forming a source/drain region having tapered stress on both sides of the channel, wherein the stress in the source/drain region first gradually increases and then gradually decreases along the height direction from the bottom, so that the stress in the device channel region is maximized;

(2) since the channel formed has a small thickness and a void is formed between the channel and the substrate, it is advantageous to suppress the short channel effect; furthermore, since what is below the channel is a void, it is advantageous for the stress in the source/drain region located on both sides of the channel to act on the channel as much as possible, thereby effectively enhancing the influence of stress on the channel carrier mobility and enhance the control effect on channel performance, and thus can better suppress and control the short channel effect.

While the exemplary embodiments and advantages thereof have been described in detail, it should be understood that various changes, substitutions and modifications can be made to these embodiments without departing from the spirit of the invention and the scope of protection defined by the appended claims. For other examples, those skilled in the art should readily understand that the order of process steps can be varied while maintaining the scope of protection of the present invention.

In addition, the range of applications of the present invention is not limited to the processes, institutions, manufacturing, composition of matter, means, methods and steps of the specific embodiments described in the description. In accordance with the disclosure of the present invention, those skilled in the art may readily understand that as for the processes, institutions, manufacturing, composition of matter, means, methods, or steps currently existing or to be developed later in which they implement substantially the same function or achieve substantially the same result as the corresponding embodiments descried in the present invention, they can be applied in accordance with the present invention. Accordingly, the appended claims of the present invention seek to include these processes, institutions, manufacturing, composition of matter, means, methods, or steps within the scope of its protection.

What is claimed is:

1. A manufacturing method for a semiconductor structure, comprising:
   a) providing a substrate, wherein a first semiconductor layer is formed on the substrate, a second semiconductor layer is formed on the first semiconductor layer, and a gate stack and a first spacer surrounding the gate stack are formed on the second semiconductor layer;
   b) removing the second semiconductor layer on both sides of the gate stack to form a device stack;
   c) forming a second spacer on both sides of the device stack, and removing a portion of the first semiconductor layer on both sides of the device stack to retain the first semiconductor layer of a certain thickness;
   d) in a part of a region along a width direction of the device stack, removing the first semiconductor layer on both sides of the device stack so as to expose the substrate;
   e) in the part of the region along the width direction of the device stack, forming a support isolation structure connected with the substrate below the second spacer and edges of both sides of the device stack;
   f) removing the remaining first semiconductor layer to form a void (112) below the device stack; and
   g) removing the second spacer, and forming source/drain regions on opposite sides of the device stack, wherein stress in the source/drain regions first gradually increases and then gradually decreases along a height direction from the bottom.

2. The manufacturing method according to claim 1, wherein the source/drain regions are formed by epitaxial growth.

3. The manufacturing method according to claim 1, wherein:
   when the device stack is a PMOS device, the substrate is a silicon substrate, and the material of the source/drain regions is SiGe, the ratio of Ge element is in a range of 5%-75% and first gradually increases and then gradually decreases along the height direction from the bottom.

4. The manufacturing method according to claim 1, wherein:
   when the device stack is an NMOS device, the substrate (130) is a silicon substrate, and the material of the source/drain regions is SiC, the ratio of C element is in a range of 0.1%-3% and first gradually increases and then gradually decreases along the height direction from the bottom.

5. The manufacturing method according to claim 1, wherein:
   an upper surface of the source/drain regions is higher than a bottom of the gate stack or at the same level as the bottom of the gate stack.

6. The manufacturing method according to claim 1, wherein the part of the region along the width direction of the device stack is regions at two ends in the width direction of the device stack.

7. The manufacturing method according to claim 1, wherein:
   a material of the first semiconductor layer is different from a material of the substrate and the second semiconductor layer.

8. The manufacturing method according to claim 1, wherein the second semiconductor layer has a thickness in a range of 10 nm to 30 nm.

9. The manufacturing method according to claim 1, wherein the step b) comprises:
   using the gate stack with a spacer as a mask and using the first semiconductor layer as an etching stop layer to etch the second semiconductor layer and form a base region below the gate stack, wherein the base region, the gate stack, and the first spacer form the device stack.

10. The manufacturing method according to claim 9, wherein the step c) comprises:
    forming a stop layer on sidewalls of the device, and forming the second spacer on sidewalls of the stop layer; and
    using the device stack with the second spacer as a mask to etch the first semiconductor layer located on both sides of the second spacer and remove the portion of the first semiconductor layer.

11. The manufacturing method according to claim 10, wherein the step d) comprises:
    forming a photolithographic mask on the semiconductor structure to cover the part of the region in the width direction of the device stack;

using the photolithographic mask and the device stack with the second spacer as a mask to etch the first semiconductor layer until the substrate is exposed; and removing the photolithographic mask.

12. The manufacturing method according to claim 11, wherein the step e) comprises:

back etching the first semiconductor layer below the device stack with the second spacer, wherein the lateral etching distance is greater than a sum of the thickness of the second spacer and the stop layer;

forming a third semiconductor layer on an upper surface and sidewalls of the first semiconductor layer by epitaxial growth; and using anisotropic etching to remove the third semiconductor layer located on the upper surface of the first semiconductor layer to form the support isolation structure.

13. A semiconductor structure, comprising a substrate, a gate stack, a spacer, a base region, source/drain regions, and a support structure, wherein:

the base region is located above the substrate and is separated from the substrate by a void;

the support isolation structure is located on both sides of the void, wherein a portion of the support isolation structure is connected with the substrate;

the gate stack is located above the base region, the sidewall surrounding the gate stack;

the source/drain regions are located on both sides of the gate stack, the base region and the support isolation structure, wherein the stress in the source/drain regions first gradually increases and then gradually decreases along a height direction from the bottom.

14. The semiconductor structure according to claim 13, wherein:

when the semiconductor structure is a PMOS device, the substrate is a silicon substrate, and a material of the source/drain regions is SiGe, Ge element has a proportion in a range of 5%-75% and first gradually increases and then gradually decreases along a height direction from the bottom.

15. The semiconductor structure according to claim 13, wherein:

when the semiconductor structure is an NMOS device, the substrate is a silicon substrate, and a material of the source/drain regions is SiC, C element has a proportion in a range of 0.1%-3% and first gradually increases and then gradually decreases along a height direction from the bottom.

16. The semiconductor structure according to according to claim 13, wherein:

an upper surface of the source/drain regions is higher than or at the same level as a bottom of the gate stack.

17. The semiconductor structure according to according to claim 13, wherein the base region has a thickness in a range of 10 nm to 30 nm.

18. The semiconductor structure according to according to claim 14, wherein:

an upper surface of the source/drain regions is higher than or at the same level as a bottom of the gate stack.

19. The semiconductor structure according to according to claim 15, wherein:

an upper surface of the source/drain regions is higher than or at the same level as a bottom of the gate stack.

20. The semiconductor structure according to claim 14, wherein the base region has a thickness in a range of 10 nm to 30 nm.

* * * * *